(12) United States Patent
Nakamura et al.

(10) Patent No.: US 8,405,445 B2
(45) Date of Patent: Mar. 26, 2013

(54) SWITCHING CIRCUIT AND IMAGING APPARATUS UTILIZING THE SAME

(75) Inventors: Kazuhiko Nakamura, Wako (JP); Yutaka Muto, Tokorozawa (JP); Kiyotaka Kogo, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 371 days.

(21) Appl. No.: 12/470,662

(22) Filed: May 22, 2009

(65) Prior Publication Data

US 2009/0295456 A1 Dec. 3, 2009

(30) Foreign Application Priority Data

May 30, 2008 (JP) ................................ 2008-143158

(51) Int. Cl.
*G01N 30/86* (2006.01)
(52) U.S. Cl. ........................................................ 327/434
(58) Field of Classification Search .................. 307/115; 327/434
See application file for complete search history.

(56) References Cited

U.S. PATENT DOCUMENTS

| | | | | |
|---|---|---|---|---|
| 4,550,359 A | * | 10/1985 | West | 361/56 |
| 4,891,764 A | * | 1/1990 | McIntosh | 700/183 |
| 6,201,713 B1 | * | 3/2001 | Hosotani | 363/19 |
| 6,542,385 B1 | * | 4/2003 | Emmons et al. | 363/17 |

FOREIGN PATENT DOCUMENTS

| | | |
|---|---|---|
| JP | 2001-045384 | 2/2001 |
| JP | 2001-298943 | 10/2001 |

OTHER PUBLICATIONS

TI TC246RGB-B0 680 x 500 Pixel Impactron Primary Color CCD Image Sensor, SOCS087—Dec. 2004—Revised Mar. 2005, pp. 1-27.
e2V A1A-CCD65_Series_Ceramic Issue 7, Jun. 2004, pp. 1-16.
Marco Flagg, Desert Star Systems, "Night and Low-Light Imaging with FrogEye and SharkEye Digital Cameras", 2nd Edition Oct. 2005.
TDK Equivalent Circuit Model Library, Ferrite Beads/ MMZ2012 Series, Dec. 2007.
Sony ICX422AL, E01X22A41 "Diagonal 11mm (Type 2/3) CCD Image Sensor for EIA B/W Video Camera", Dec. 1, 2003, pp. 1-17.
TDK "Chip Beads (SMD) for Signal Line" 006-02, Apr. 8, 2008, pp. 1-4.

* cited by examiner

*Primary Examiner* — Daniel Cavallari
(74) *Attorney, Agent, or Firm* — Brundidge & Stanger, P.C.

(57) ABSTRACT

In a complementary-MOSFET driving circuit for driving the charge multiplication gate of an EM-CCD, a ferrite bead is connected to a conduction-termination direction diode in parallel thereto, the conduction-termination direction diode being inserted into the gate electrodes of complementary MOSFETs in series therewith, the impedance of the ferrite bead at a switching frequency being lower than one-half of the gate-electrode impedance of the MOSFETs, a time during which the MOSFETs are brought into simultaneous conduction being shorter than ¼th of the switching period, the impedance of the ferrite bead at a frequency equivalent to ¼th of the switching period being higher than 2 times the gate-electrode impedance of the MOSFETs, a ferrite bead being connected to the drain electrodes of the complementary MOSFETs in series therewith, the impedance of the ferrite bead at the switching frequency being lower than one-half of the impedance of a capacitive load at the switching frequency, and the impedance of the ferrite bead, at a frequency equivalent to ¼th of the switching period being higher than 2 times the impedance of the capacitive load.

5 Claims, 9 Drawing Sheets

US 8,405,445 B2

SWITCHING CIRCUIT AND IMAGING APPARATUS UTILIZING THE SAME

INCORPORATION BY REFERENCE

The present application claims priority from Japanese application JP2008-143158 filed on May 30, 2008, the content of which is hereby incorporated by reference into this application.

BACKGROUND OF THE INVENTION

The present invention relates to a switching circuit of capacitive load. More particularly, it relates to an improvement in the driving circuit for charge multiplication gate of an electron-multiplying charge-coupled-device imaging device.

As the charge-multiplication-gate driving circuit of the charge-coupled-device (which, hereinafter, will be abbreviated as "CCD") imaging device as well, the driving logic integrated circuit for the CCD imaging device is available if voltage amplitude of the driving-target CCD imaging device is smaller than 5 V. Also, the general-purpose CMOS logic integrated circuit is available if the voltage amplitude is smaller than 6 V (reference should be made to the SONY-fabricated ICX422AL 11-mm diagonal (2/3 type) EIA block-and-white-designed solid imaging device J01X22A41).

In the electron-multiplying CCD imaging device (which, hereinafter, will be abbreviated as "EM-CCD"), the sensitivity can be enhanced by combining the EM-CCD with electron cooling. In the charge multiplication gate (which, hereinafter, will be abbreviated as "CMG") for performing the electron multiplication of the EM-CCD, however, the following drawbacks exist: For example, in the TEXAS INSTRUMENTS (which, hereinafter, will be abbreviated as "TI")-fabricated 330000-pixel CMG, when the capacitive load is about 25 pF, the impedance at 12.5 MHz becomes equal to about 509Ω, which is a significantly heavy load. Also, the CMG voltage amplitude falls in a range of 18 Vp-p to 24 Vp-p, which is large and variable. In addition, at the high electron-multiplying time when the CMG voltage amplitude is large, the sensitivity varies by the amount of 1.4 times as a result of a 0.1-V voltage variation. Also, the sensitivity varies by the amount of 1.8 times as a result of a 11-° C. temperature variation. Accordingly, it is requested to ensure the voltage amplitude of the driving waveform, high stability, and reduction in the heat liberation, i.e., power consumed. For example, in the e2V Technology (which, hereinafter, will be abbreviated as "e2V")-fabricated CMG, the CMG voltage amplitude falls in a range of 35 Vp-p to 45 Vp-p, which is even larger. Consequently, unlike other electrode drivings for the CCD imaging device, it is difficult to utilize the general-purpose integrated circuit whose withstand voltage is equal to about 18 V. In view of this situation, the following technique is commonly used: A pulse waveform is supplied to the CMG for performing the electron multiplication of the EM-CCD via the drain of a complementary enhancement-type metal-oxide-semiconductor field-effect transistor (: MOSFET) whose power-supply voltage is variable. Then, the CMG is driven using the CMOS logic integrated circuit to which the gate of the MOSFET is capacitively connected. Also, in the read-out CMG, e.g., the TI-fabricated 330000-pixel CMG, when the capacitive load is about 85 pF and about 55 pF, the impedance at 12.5 MHz becomes equal to about 150Ω and about 231Ω, which are significantly heavy loads. Accordingly, the integrated circuits referred to as "pin drivers" are used whose voltage amplitude is equal to about 8 Vp-p and whose withstand voltage is equal to about 18 V (reference should be made to the TI-fabricated TC246RGB-B0 680×500 PIXEL IMPACTRONTM PRIMARY COLOR CCD IMAGE SENSOR SOCS087-DECEMBER 2004-REVISED MARCH 2005, and e2V-fabricated A1A-CCD65_Series_Ceramic Issue 7, June 2004). Since the horizontal resolving power lowers at the high electron-multiplying time when the CMG voltage amplitude is large, the CMG voltage amplitude is reduced down to its minimum by cooling the EM-CCD (reference should be made to the Desert Star Systems-fabricated Night and Low-Light Imaging with Frog Eye™ and Shark Eye™ Digital Cameras, Application Note 2nd Edition 28OCT05). It is estimated that the lowering in the horizontal resolving power occurs because, at the high electron-multiplying time when the CMG voltage amplitude is large, rectangular-wave characteristics of the CMG deteriorate and thus the horizontal transfer becomes incomplete. Also, there occurs a state which is referred to as "blooming". In this blooming state, charge carriers, which leak out to a vertical transfer path due to an excessive light amount, overflow one after another to an accumulation-unit transfer path and a horizontal transfer path.

Also, FIG. 7 is a block diagram for illustrating the configuration of a conventional and commercially-available complementary-MOSFET driving circuit (reference should be made to JP-A-2001-298943). In this complementary-MOSFET driving circuit, the conduction time and the non-conduct ion time are made substantially equal to each other for being used as the nominal 12-V battery-input switching power-supply which is designed for the voltage of 10.5 V to 17 V of small-sized automobiles and broadcasting cameras, and for being used for driving the non-multiplication charge multiplication gate Hφ. FIG. 8 is a schematic diagram for illustrating the input/output voltage operation of the conventional complementary-MOSFET driving circuit.

In FIG. 7 and FIG. 8, when an output voltage Vout4 of an IC 4 for driving the gate of a MOSFET becomes equal to 0 V, a diode D6 is brought into the conduction. Accordingly, the gate voltage of a Pch-MOSFEI Q1 is driven by a resistor 5, thereby being caused to exceed a threshold voltage in a comparatively long time. As a result, the Pch-MOSFET Q1 starts the conduction (i.e., turns on). Meanwhile, when the output voltage Vout4 of the IC 4 for driving the gate of the MOSFET becomes equal to 5 V, a diode D7 is brought into the conduction. Accordingly, the gate voltage of the Pch-MOSFET Q1 is driven by a resistor 6, thereby being caused to rise up to the threshold voltage in a short time. Moreover, the gate voltage remains at the threshold voltage until charge carriers have been extracted. Then, the Pch-MOSFET Q1 terminates the conduction (i.e., turns off) in a comparatively long time.

Similarly, when the output voltage Vout4 of the IC 4 for driving the gate of the MOSFET becomes equal to 0 V, the diode D8 is brought into the conduction. Accordingly, the gate voltage of an Nch-MOSFET Q2 is driven by the resistor 7, thereby being caused to drop down to a threshold voltage in a short time. Moreover, the gate voltage remains at the threshold voltage until charge carriers have been extracted. Then, the Nch-MOSFET Q2 turns off in a comparatively long time. Meanwhile, when the output voltage Vout4 of the IC 4 for driving the gate of the MOSFET becomes equal to 5 V, a diode D9 is brought into the conduction. Accordingly, the gate voltage of the Nch-MOSFET Q2 is driven by the resistor 8, thereby being caused to exceed the threshold voltage in a comparatively long time. As a result, the Nch-MOSFET Q2 turns on.

The inter-gate-source capacity of a MOSFET (which, hereinafter, will be abbreviated as "Cgs") is proportional to the product of the drain-source withstand voltage (which, hereinafter, will be abbreviated as "withstand voltage") and the drain current capacity (which, hereinafter, will be abbreviated as "current capacity"), and is substantially proportional to the fineness of machining (i.e., design rule) as well. For example, in the 2006-year-mass-produced 30-V withstand voltage MOSFETs, such as the SANYO-fabricated MCH3335 and MCH3435, the Pch peak current capacity is equal to about 40 pF at 1.6 A, and the Nch peak current capacity is equal to about 30 pF at 2.8 A. Also, the gate charge carriers (which, hereinafter, will be abbreviated as "Qg") are proportional to the product of the withstand voltage and the current capacity, the drain current, and is substantially proportional to the fineness of machining as well. In the above-described 2006-year-mass-produced 30-V withstand voltage MOSFETs, such as the SANYO-fabricated MCH3335 and MCH3435, Qg is equal to about 2100 pC per the 1-A Pch current, and is equal to about 1400 pC per the 1-A Nch current. As a result, the Pch-MOSFET is delayed in its turn-off.

Also, the practical commercialization has been already accomplished concerning the circuit for performing constant-current driving for basic electrodes of the CCD imaging device using bipolar transistors and with a horizontal synchronization period which is slow, i.e., about 600 times as large as the horizontal transfer (reference should be made to JP-A-2001-45384).

By the way, in recent years, in order to reduce unnecessary radiation, the following ferrite bead has been mass-produced in a variety of types: At a low frequency, its impedance is low. Then, from a certain specific frequency, its impedance becomes higher steeply, and its resistance component becomes larger (reference should be made to TDK-fabricated 006-02/20080408/e9412_mmz2012). The approximately equivalent circuit to the ferrite bead is a circuit which is obtained by connecting an in-parallel connection of an inductor, a capacitor, and a resistor to a resistor in series with each other (reference should be made to TDK-fabricated mmz2012 Equivalent Circuit).

There also exists the Schottky barrier diode where the forward-direction drop voltage VF is reduced down to 0.13 V with the reverse-direction leakage current IR remaining reduced.

In the above-described conventional technologies where the conduction time and the non-conduction time are made substantially equal to each other, in FIG. 7, i.e., the block diagram for illustrating the configuration of the conventional complementary-MOSFET driving circuit, in the resistor-in-series diodes D6 to D9 which are connected in series to the resistors connected to the gates of the MOSFETs, the gate driving amplitude decreases by the amount of 1.2 V, i.e., two times as large as the 0.6-V diode forward-direction drop voltage, and thus the gate driving amplitude becomes equal to 3.8 V. This operation is exactly illustrated in FIG. 8, i.e., the schematic diagram for illustrating the input/output voltage waveform of the operation of the conventional complementary-MOSFET driving circuit. In FIG. 8, since impedances of the resistors R3 and R4 are low, the currents R3 and R4 are large. Also, since the value of Qg1 is large, Vcmg becomes unbalanced.

In the switching circuit for driving the charge multiplication gate (: CMG) for performing the electron multiplication of the EM-CCD, the CMG voltage amplitude falls in a range of, e.g., 18 Vp-p to 24 Vp-p, or 35 Vp-p to 45 Vp-p, which is significantly large. Accordingly, the MOSFET is unusable which is used for the battery-input switching power-supply, and for driving the non-multiplication charge multiplication gate Hϕ, and whose withstand voltage is low, and whose inter-gate-source (control) voltage at which the conduction resistance substantially saturates is low. The gate voltage at which the ON resistance of the CMG-driving Pch-MOSFET drops is equal to, e.g., 4.5 V, which is significantly high. Consequently, the above-described conventional technologies, where the conduction time and the non-conduction time are made substantially equal to each other, is inapplicable to the CMG driving. On account of this, there occurs a simultaneous conduction time during which the Nch-MOSFET and the Pch-MOSFET are simultaneously brought into the conduction, which gives rise to the consumption of ineffective power. Accordingly, it is expected that the heat liberation amount will increase by the amount equivalent to a significant loss due to the ineffective power, and that the temperature will rise thereby to lower the sensitivity of the EM-CCD. On account of this, instead of reducing the current at which the Nch-MOSFET and the Pch-MOSFET are simultaneously brought into the conduction, an about 33-Ω large-permissible-loss resistor is inserted into between the drains of the Nch-MOSFET and the Pch-MOSFET. Here, the CMG capacity is equal to about 25 pF, and the impedance at 12.5 MHz is equal to about 509Ω. As a result, an attenuation of the CMG voltage amplitude, e.g., 24 Vp-p, is made equal to (24V×509/509+33+2)=22.5 V. Consequently, it turns out that the voltage drop caused by R3, R4, and the CMG in FIG. 7 has been allowed by the amount of as much as 1.5 V. In, e.g., the TI-fabricated TC246, this 1.5-V voltage drop is equivalent to an approximately 1/160th sensitivity lowering. This is because, in the maximum sensitivity operation of TC246, the sensitivity varies by the amount of 1.4 times as a result of a 0.1-V voltage amplitude variation.

Also, like the Desert Star Systems-fabricated product in the Related Art, the horizontal resolving power lowers at the high electron-multiplying time when the CMG voltage amplitude is large. Moreover, the blooming in the horizontal transfer becomes deteriorated.

SUMMARY OF THE INVENTION

Namely, an object of the present invention is to solve the above-described problems by preventing an attenuation of the amplitude of the load capacity, and improving the rectangular-wave characteristics while reducing a feedthrough current at which the Nch-MOSFET and the Pch-MOSFET are mutually brought into the simultaneous conduction.

According to the present invention, there is provided a switching circuit whose power-supply voltage exceeds 6 V, and which drives a load, the switching circuit including a Pch switching device, an Nch switching device, and a logic buffer, wherein at least either of an impedance unit and an in-series connection of an in-parallel connection of an inductor, a capacitor, and a resistor with a resistor is connected to a conduction-termination direction diode in parallel thereto, the impedance unit being able to be represented as an approximately equivalent circuit by the in-series connection of the in-parallel connection of the inductor, the capacitor, and the resistor with the resistor, impedance of the impedance unit at a switching fundamental-wave frequency being lower than substantially one-half of gate-electrode impedance of the Pch switching device and the Nch switching device, the conduction-termination direction diode being inserted in series into between the logic buffer output and gate electrodes of the Pch switching device and the Nch switching device.

Also, according to the present invention, there is provided a switching circuit whose power-supply voltage exceeds 6 V, and which drives a load, the switching circuit including a Pch switching device, an Nch switching device, and a logic buffer, wherein at least either of an impedance unit and an in-series connection of an in-parallel connection of an inductor, a capacitor, and a resistor with a resistor is inserted into at least one drain electrode of the Pch switching device and the Nch switching device, the impedance unit being able to be represented as an approximately equivalent circuit by the in-series connection of the in-parallel connection of the inductor, the capacitor, and the resistor with the resistor, impedance of the impedance unit at a switching fundamental-wave frequency being lower than substantially one-half of impedance of the capacitive load at the switching fundamental-wave frequency.

Namely, according to the present invention, there is provided the following switching circuit: In the inversion switching circuit, a high-frequency current, i.e., the main component of a feedthrough current, is limited by lowering the electrodes-in-series impedance of the semiconductor devices at a load-driving-pulse frequency, and heightening the electrodes-in-series impedance of the semiconductor devices at a feedthrough-current frequency, or by lowering the electrodes-in-series impedance of the semiconductor devices in a conduction-start (i.e., turn-on) direction, and heightening the electrodes-in-series impedance of the semiconductor devices in a conduction-termination (i.e., turn-off) direction.

Moreover, an object of the present invention is to provide an imaging apparatus including the above-described switching circuit and an electron-multiplying charge-coupled-device (EM-CCD) imaging device, wherein the switching circuit is used for driving the charge multiplication gate (CMG) of the EM-CCD.

As having been explained so far, according to the present invention, in the case of driving the CMG of the EM-CCD whose CMG voltage amplitude falls in a range of, e.g., 18 Vp-p to 24 Vp-p, or 35 Vp-p to 45 Vp-p, which is large and variable, and in addition, whose sensitivity varies by the amount of 1.4 times as a result of a 0.1-V voltage amplitude variation at the high electron-multiplying time when the CMG voltage amplitude is large, the attenuation of the CMG voltage amplitude is decreased to decrease the sensitivity lowering by lowering the electrodes-in-series impedance of the Nch-MOSFET and the Pch-MOSFET at the load-driving-pulse frequency. This decrease in the sensitivity lowering results in implementation of a sensitivity enhancement which is a few tens of times higher as compared with the approximately $1/160$th sensitivity lowering in the conventional embodiment. This approximately $1/160$th sensitivity lowering has been equivalent to the 1.5-V voltage drop caused by R3, R4, and the CMG in FIG. 7, since the sensitivity varies by the amount of 1.4 times as a result of a 0.1-V voltage amplitude variation.

Also, according to the present invention, the high-frequency current is reduced, which is the main component of the feedthrough current at which the Pch-MOSFET and the Nch-MOSFET are mutually brought into the simultaneous conduction. As a result, the power loss is decreased to decrease the heat liberation and temperature rise by the amount corresponding to the power loss. Accordingly, the sensitivity of the EM-CCD, which varies by the amount of 1.8 times as a result of a 11-° C. temperature variation, is enhanced even further.

Furthermore, a high impedance unit is inserted in parallel to the conduction-termination (i.e., turn-off) direction diode which is inserted into the gate electrodes of the Pch-MOSFET and the Nch-MOSFET in series therewith. This insertion short-circuits a conduction-start (i.e., turn-on) direction diode which is inserted into the gate electrodes of the Pch-MOSFET and the Nch-MOSFET in series therewith, eliminates the forward-direction drop voltage of the conduction-start (i.e., turn-on) direction diode, sufficiently ensures the gate-source voltages of the Pch-MOSFET and the Nch-MOSFET at the time of the conduction, lowers the ON resistances of the Pch-MOSFET and the Nch-MOSFET at the time of the conduction, and improves the rectangular-wave characteristics of the CMG voltage, thereby enhancing the sensitivity of the EM-CCD even further. The improvement of the rectangular-wave characteristics of the CMG voltage makes it highly unlikely that there will occur the lowering in the horizontal resolving power at the high electron-multiplying time when the CMG voltage amplitude is large, and that there will occur the blooming, i.e., the phenomenon that charge carriers, which leak out to a vertical transfer path due to an excessive light amount, overflow one after another from an accumulation-unit transfer path to a horizontal transfer path.

Other objects, features and advantages of the invention will become apparent from the following description of the embodiments of the invention taken in conjunction with the accompanying drawings.

DESCRIPTION OF THE INVENTION

Hereinafter, referring to a block diagram in FIG. 9, the explanation will be given below concerning an imaging apparatus where a switching circuit according to an embodiment of the present invention is used for driving the charge multiplication gate (CMG) of the electron-multiplying charge-coupled-device (EM-CCD) imaging device. Moreover, the explanation will be given below regarding the switching circuit according to the embodiment of the present invention, referring to block diagrams illustrated in FIG. 1, FIG. 2, and FIG. 3, and waveform schematic diagrams illustrated in FIG. 4, FIG. 5, and FIG. 6.

Figure 9:
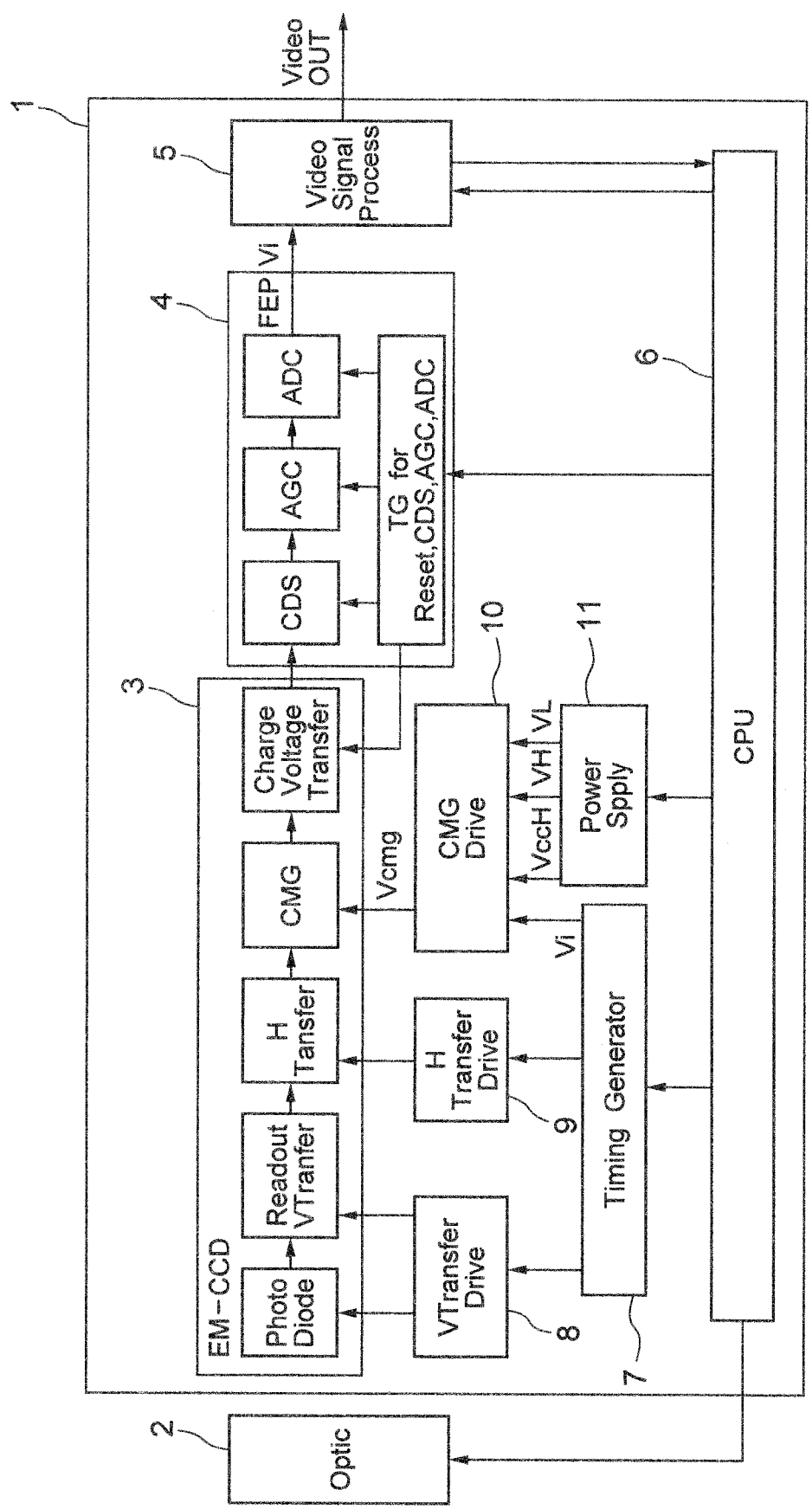
FIG. 9 is a block diagram for illustrating the configuration of an imaging apparatus using the EM-CCD imaging device.

FIG. 9 is the block diagram for illustrating the configuration of the imaging apparatus using the EM-CCD imaging device. In FIG. 9, the reference numeral 1 denotes the imaging apparatus, and 2 denotes a lens. Inside the imaging apparatus, 3 denotes the EM-CCD, 4 denotes a FEP (Front End Processor), 5 denotes a video-signal processing unit, 6 denotes a CPU, 7 denotes a timing generator (which, hereinafter, will be abbreviated as "TG"), 8 denotes a vertical-transfer driving unit, 9 denotes a horizontal-transfer driving unit, and 10 denotes a charge-multiplication-gate (: CMG) driving unit for performing the electron multiplication of the EM-CCD. Here, the FEP 4 builds therein a CDS (Correlated Double Sampling) for eliminating noise, a dark-current correction & gain variable amplification circuit (Automatic Gain Control, which, hereinafter, will be abbreviated as "AGC"), and an ADC (Analog Digital Converter) for converting an analog video signal into a digital video signal Vi. Also, in some cases, the video-signal processing unit 5, the CPU 6, and the TG 7 are integrated into an integrated circuit such as FPGA (Field Programmable Gate Array).

Hereinafter, the explanation will be given below concerning the operation performed when the switching circuit according to the embodiment of the present invention is used for the CMG driving unit 10 illustrated in FIG. 9. Here, FIG. 9 is the block diagram for illustrating the configuration of the imaging apparatus using the EM-CCD whose CMG voltage amplitude falls in a range of, e.g., 18 Vp-p to 24 Vp-p, or 35 Vp-p to 45 Vp-p, which is large and variable.

Figure 7:
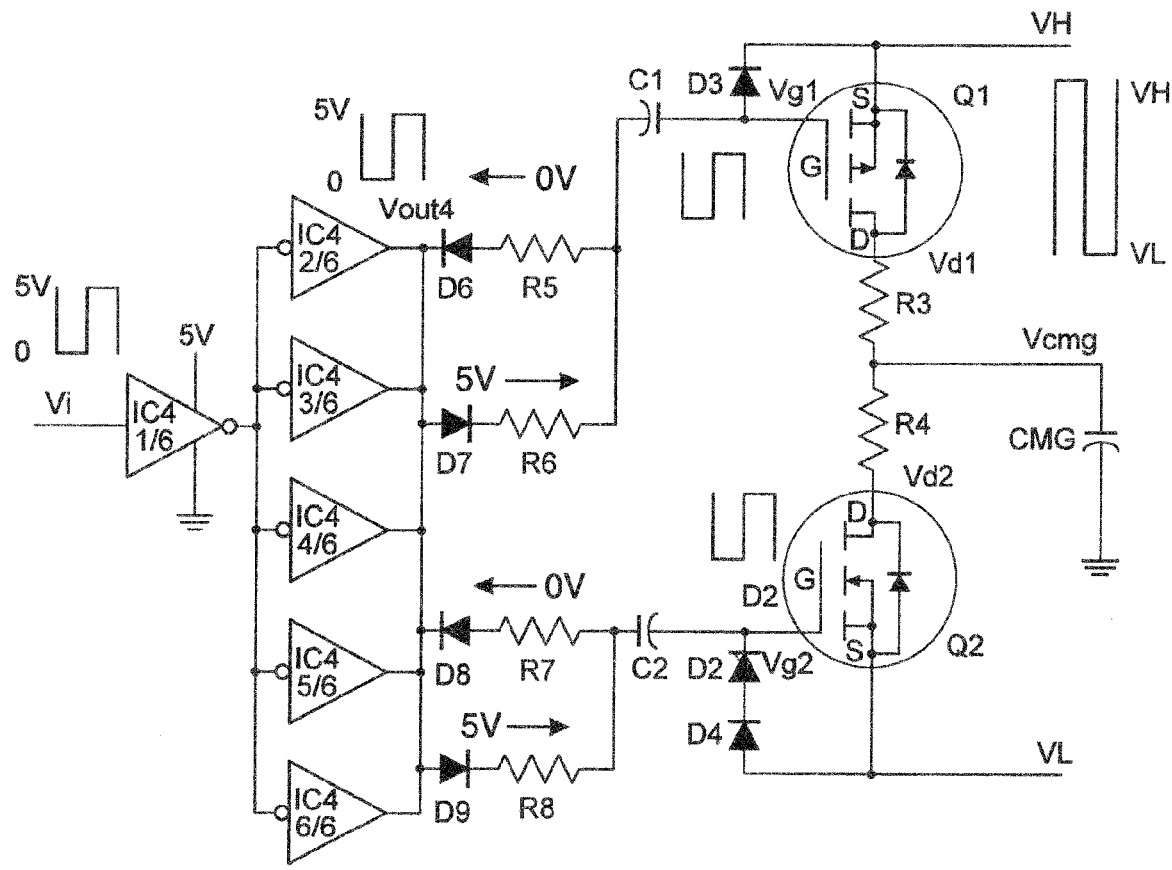
FIG. 7 is the block diagram for illustrating the configuration of the complementary-MOSFET driving circuit in the conventional embodiment.
Figure 8:
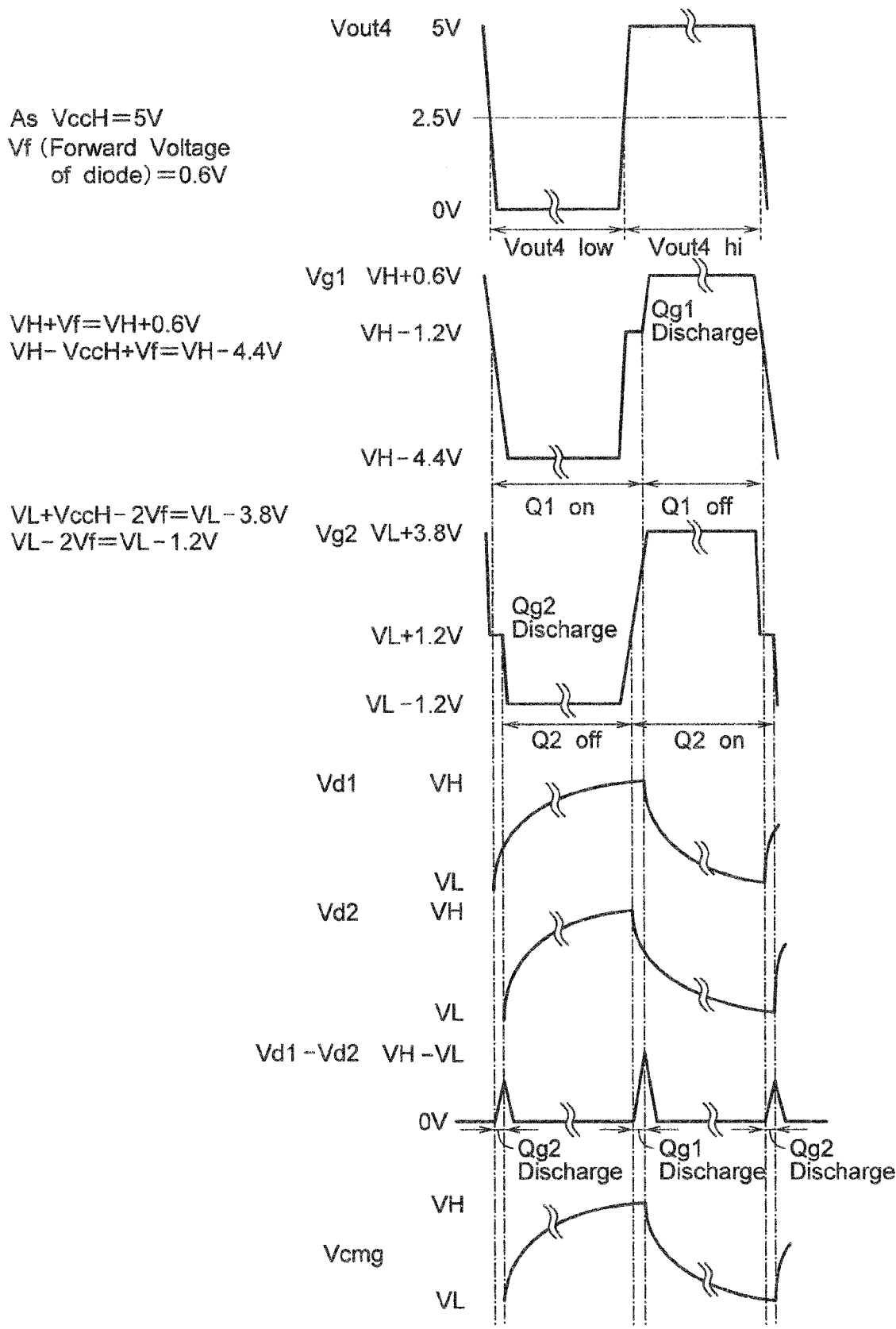
FIG. 8 is the schematic diagram for illustrating the input/output waveform operation of the complementary-MOSFET driving circuit in the conventional embodiment.

In FIG. 7, which is the block diagram for illustrating the configuration of the complementary-MOSFET driving circuit in the conventional embodiment, as is indicated in FIG. 8, which is the schematic diagram for illustrating the input/output waveform operation of the complementary-MOSFET driving circuit in the conventional embodiment, by inserting the feedthrough-current reduction and limitation resistance (R3+R4), i.e., 33Ω, the CMG voltage amplitude is attenuated by the amount of (24V*509/509+33+2)=22.5 V, i.e., as much as 1.5 V as the voltage drop caused by R3, R4, and the CMG in FIG. 7. Conventionally, this 1.5-V voltage drop has been equivalent to the approximately $\frac{1}{160}$th sensitivity lowering. This is because, in the maximum sensitivity operation of the TI-fabricated TC246, the sensitivity varies by the amount of 1.4 times as a result of a 0.1-V voltage amplitude variation. In this exemplification, 24V is the pulse amplitude in the case of not being attenuated, i.e., the power-supply voltage value, and the CMG capacity is equal to about 25 pF, and the impedance at 12.5 MHz is equal to about 509Ω. In contrast thereto, when the resistance (R3+R4) is set at 33Ω, and the conduction resistance of the MOSFET is set at 2Ω, the impedance-divided ratio in the case of attenuating the pulse amplitude has been set at 509/(509+33+2).

According to the embodiments of the present invention, in the case of driving the CMG of the EM-CCD whose sensitivity varies by the amount of 1.4 times as a result of a 0.1-V CMG voltage amplitude variation, the attenuation of the CMG voltage amplitude is decreased to decrease the sensitivity lowering by lowering the electrodes-in-series impedance of the Nch-MOSFET and the Pch-MOSFET at the load-driving-pulse frequency. This decrease in the sensitivity lowering results in the implementation of the sensitivity enhancement which is a few tens of times higher as compared with the approximately $\frac{1}{160}$th sensitivity lowering in the conventional embodiment.

Also, according to the embodiments of the present invention, the high-frequency current is reduced, which is the main component of the feedthrough current at which the Pch-MOSFET and the Nch-MOSFET are mutually brought into the simultaneous conduction. As a result, the power loss is decreased to decrease the heat liberation and temperature rise by the amount corresponding to the power loss. Accordingly, the sensitivity of the EM-CCD, which varies by the amount of 1.8 times as a result of a 11-° C. temperature variation, is enhanced even further.

Figure 1:
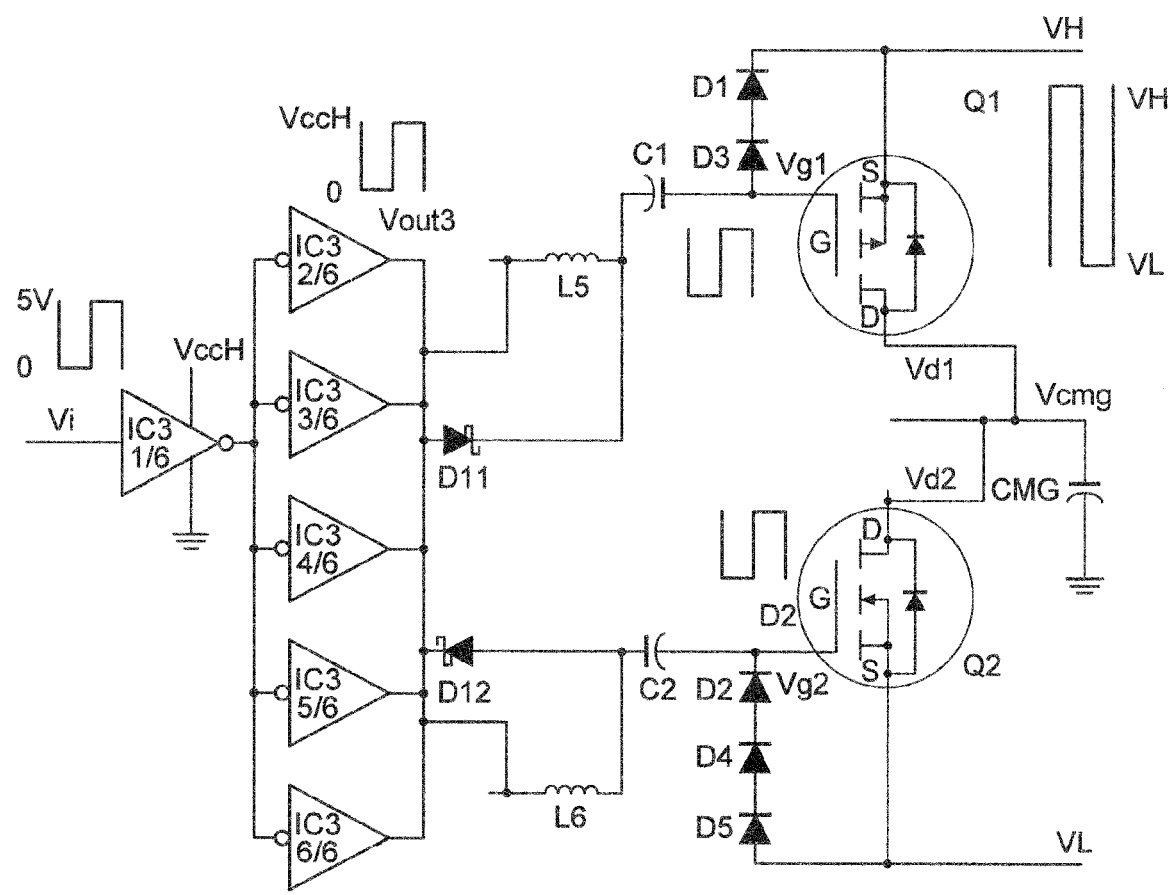
FIG. 1 is a block diagram for illustrating the configuration of a complementary-MOSFET driving circuit in an embodiment of the present invention (ferrite bead is inserted in series with the gate)
Figure 2:
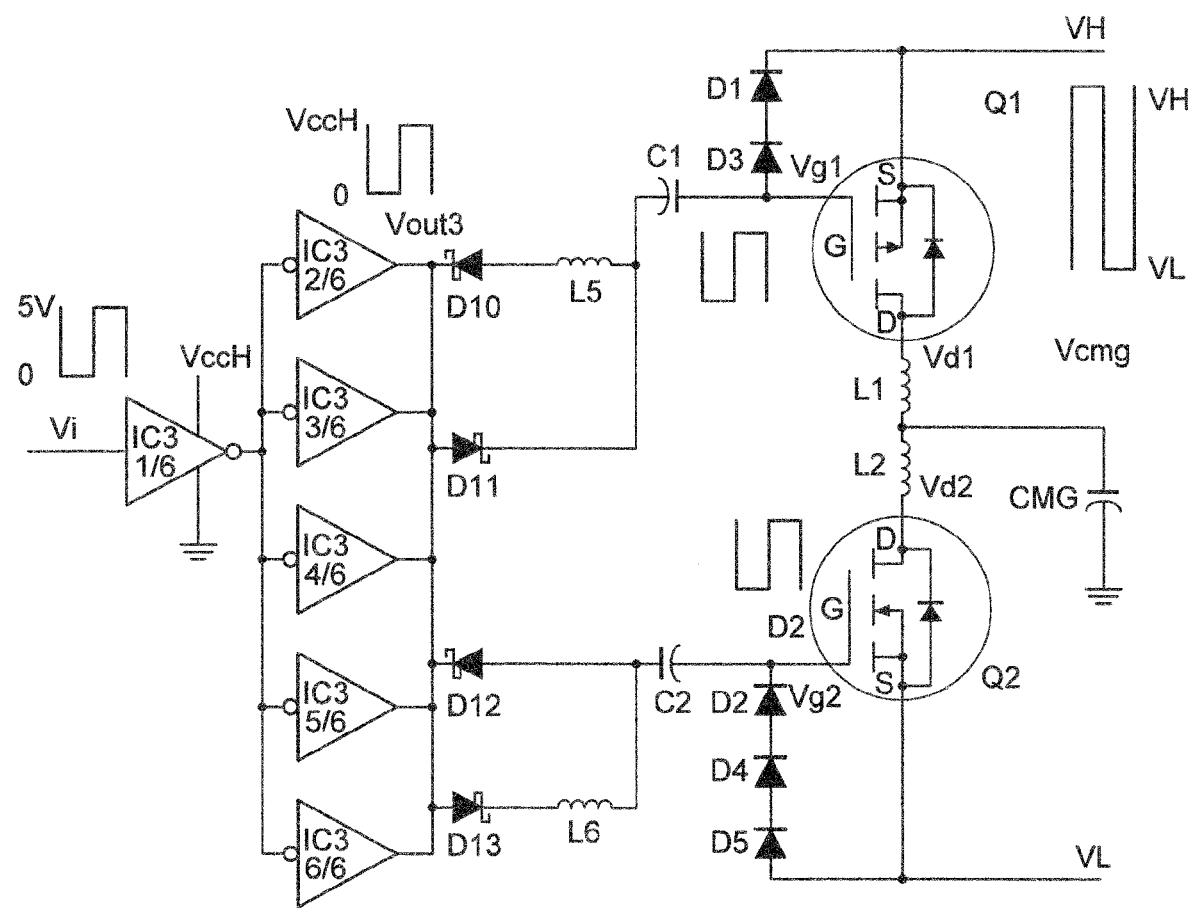
FIG. 2 is a block diagram for illustrating the configuration of the complementary-MOSFET driving circuit in another embodiment of the present invention (ferrite bead is inserted in series with the gate and in series with the drain)
Figure 3:
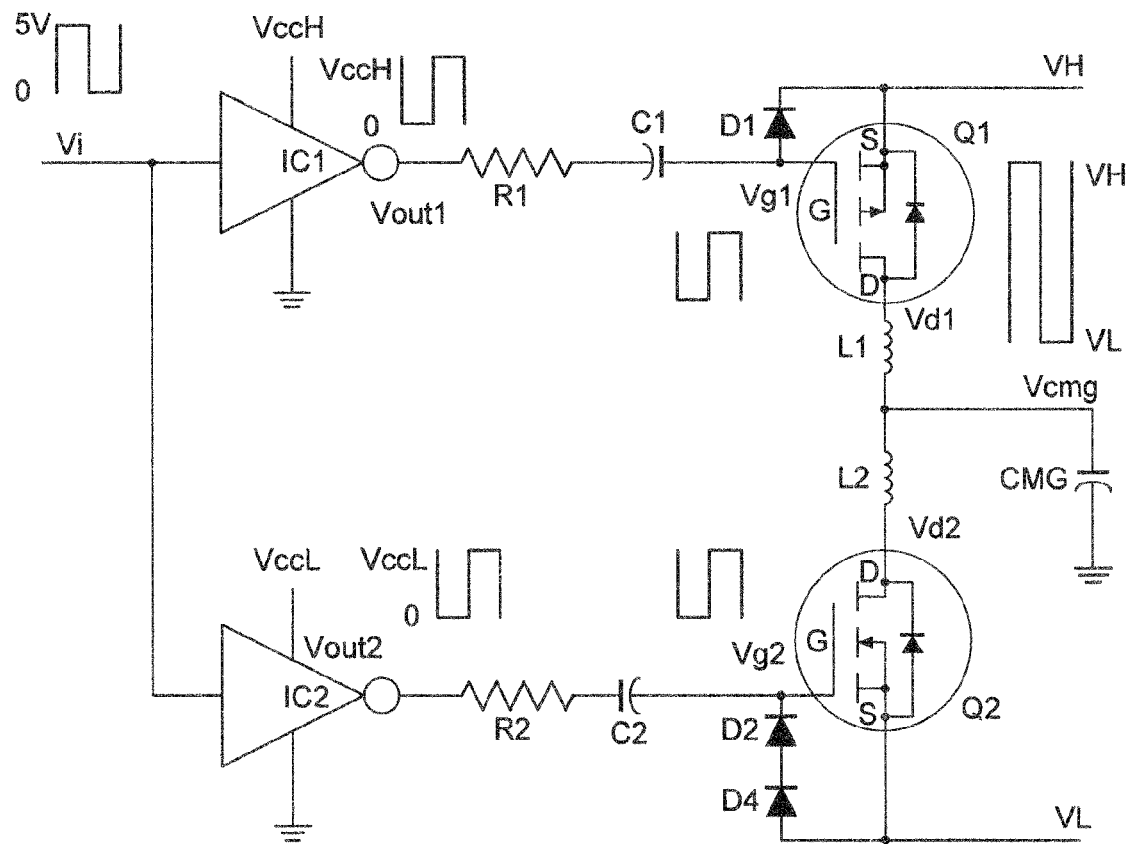
FIG. 3 is a block diagram for illustrating the configuration of the complementary-MOSFET driving circuit in still another embodiment of the present invention (ferrite bead is inserted in series with the drain)

Hereinafter, the explanation will be given below concerning the switching circuit according to an embodiment of the present invention, referring to the block diagrams illustrated in FIG. 1, FIG. 2, and FIG. 3, and the timing-waveform schematic diagrams illustrated in FIG. 4, FIG. 5, and FIG. 6. FIG. 1 illustrates a configuration embodiment of the switching circuit in a case where Q1 and Q2 are not brought into the simultaneous conduction in a state where the compatibility of characteristics of gate-driving ferrite beads L5 and L6 is preferable. Here, at a switching fundamental-wave frequency, the impedance of each ferrite bead is sufficiently low, i.e., lower than $\frac{1}{10}$th as compared with impedance of the gate-electrode capacitor or impedance of the CMG capacitor, and, at a frequency whose corresponding period is equal to the turn-off time of the switching, the impedance of each ferrite bead is sufficiently high, i.e., higher than 10 times as compared therewith. FIG. 2 illustrates another configuration embodiment of the switching circuit in the following case: Even if the compatibility of the characteristics of the gate-driving ferrite beads L5 and L6 is not necessarily at a desirable level, the ferrite-beads conductions are limited only to the gate and the turn-on time by using the Schottky barrier diode of the ferrite-beads in-series connection. Moreover, even if there still remains a short time during which Q1 and Q2 are brought into the simultaneous conduction, the feedthrough current is reduced by using the ferrite beads L5 and L6 which are connected to between both drains G and G of Q1 and Q2. FIG. 3 illustrates still another configuration embodiment of the switching circuit in the case where the feedthrough current is reduced by using the ferrite beads which are connected to the drains.

FIG. 1 and FIG. 2 are the block diagrams for illustrating the switching circuits according to the embodiments of the present invention, where the MOSFET driving circuits drive the gates comparatively late at the turn-on time, and drive the gates comparatively early at the turn-off time. FIG. 3 is the block diagram for illustrating the switching circuit according to still another embodiment of the present invention, where the high-frequency current is reduced, which is the main component of the feedthrough current, at the comparatively early turn-on time of the MOSFETs. FIG. 4 and FIG. 5 are the schematic diagrams for illustrating the input/output voltages of the operations of the embodiments of the present invention, where the MOSFET driving circuits drive the gates comparatively late at the turn-on time, and drive the gates comparatively early at the turn-off time. FIG. 6 is the schematic diagram for illustrating the input/output voltage of the operation of still another embodiment of the present invention, where the high-frequency current is reduced, which is the main component of the feedthrough current at the comparatively early turn-on time of the MOSFETs. In FIG. 5 and FIG. 6 described above, since the impedances of L1 and L2 at the turn-off frequency are high, currents L1 and L2 are extremely small. Each of the impedance units L1, L2, L5, and L6 to be used in the embodiments of the present invention is formed as follows: A first in-parallel connection of a ferrite bead (or a similar-frequency-characteristics-exhibiting inductor) and a capacitor is formed. Next, a second in-parallel connection of the first in-parallel connection formed and a resistor is formed. Finally, an in-series connection of the second in-parallel connection formed and a resistor is formed, which is each impedance unit (i.e., an in-series connection of a second in-parallel connection of a first in-parallel connection of a ferrite bead (or a similar-frequency-characteristics-exhibiting inductor) and a capacitor, and a resistor with a resistor).

In FIG. 1, FIG. 2, FIG. 3, FIG. 4, FIG. 5, and FIG. 6, VccH, VccL, and 5 V denote logic power-supplies, VH and VL denote switching-circuit power-supplies, and IC1 and IC2 denote CMOS inverter logic integrated circuits (invICs). In FIG. 1, IC3 1/6~6/6 are illustrated such that common 6-piece invICs are configured into a 1-input/5-output in-series connection. IC3 1/6~6/6, however, may also be a single 1-gate/1-package CMOS buffer logic integrated circuit (BufIC).

Q1 denote the Pch-MOSFET, Q2 denote the Nch-MOSFET, D1~D5 denote direct-current reproduction diodes, and D10~D13 denote reverse-flow preventing Schottky barrier diodes (which, hereinafter, will be abbreviated as "SBDs"). Also, CMG denote the electron-multiplying charge multiplication gate of the EM-CCD, C1 and C2 denote alternating-current coupling capacities, R1 and R2 denote the gate-driving resistors, and L1, L2, L5, and L6 denote the ferrite beads. Here, the impedance of each ferrite bead at a clock fundamental-wave frequency is lower than the impedance of the capacitive load at the clock fundamental-wave frequency, and the impedance amount of each ferrite bead is high at a frequency whose corresponding half-period is equal to the simultaneous conduction time of the switching circuit.

In FIG. 1, FIG. 2, FIG. 3, FIG. 4, FIG. 5, and FIG. 6, Vi denote the input waveform of a logic circuit 1, a logic circuit 2, and a logic circuit 3, Vout1 denote the output waveform of the logic circuit 1 IC1, Vout2 denote the output waveform of the logic circuit 2 IC2, Vout3 denote the output waveform of the logic circuits 3 IC3 2/6~6/6, Vg1 denotes the gate-voltage waveform of the Pch-MOSFET Q1, Vg2 denotes the gate-voltage waveform of the Nch-MOSFET Q2, Vd1 denotes the drain-voltage waveform of the Pch-MOSFET Q1, Vd2 denotes the drain-voltage waveform of the Nch-MOSFET Q2, and Vcmg denotes the output-voltage waveform applied to the load capacity CMG.

Between the block diagrams in FIG. 1, FIG. 2, and FIG. 3 for illustrating the embodiments of the present invention, and the block diagram in FIG. 7 for illustrating the embodiment of the conventional technologies, the differences therebetween are as follows: Namely, not only executing the control over the output impedance by using a plurality of combinations of the diodes D6, D7, and D8 and the resistors R5, R6, R7, and R8 with respect to the output Vout4 of the logic integrated circuits IC4 1/6~6/6 as is illustrated in FIG. 7, the high-frequency current, i.e., the main component of the feedthrough current, is limited by using the ferrite beads. Here, the impedance of each ferrite bead at the clock fundamental-wave frequency is lower than the impedance of the capacitive load at the clock fundamental-wave frequency, and the impedance amount of each ferrite bead is high at the frequency whose corresponding half-period is equal to the simultaneous conduction time of the switching circuits (Q1, Q2, and the like). Moreover, the attenuation of the CMG voltage amplitude is decreased by lowering the electrodes-in-series impedance of the Nch-MOSFET and the Pch-MOSFET at the load-driving-pulse frequency. Furthermore, conduction-start (i.e., turn-on) direction diodes D10 and D13 which are inserted into the gate electrodes G and G of the Pch-MOSFET and the Nch-MOSFET in series therewith are short-circuited by inserting the ferrite beads L5 and L6 in parallel to conduction-termination (i.e., turn-off) direction diodes D11 and D12 which are inserted into the gate electrodes G and G of the Pch-MOSFET and the Nch-MOSFET in series therewith.

Hereinafter, referring to FIG. 1, FIG. 2, FIG. 4, and FIG. 5, the explanation will be given below regarding an embodiment of the present invention.

In FIG. 1 and FIG. 2, the gate voltage at which the ON resistance of the Pch-MOSFET Q1 drops is equal to, e.g., 4.5V, which is significantly high. Accordingly, VccH is set at a value which is lower than the recommendable maximum voltage of IC1. Namely, if the product type of IC3 1/6~6/6 is 74 AC whose pin deployment is the same as the TTL logic IC 74 LS, which allows high-speed driving, whose driving current is large, and whose withstand voltage is comparatively high, VccH is set at 6 V or lower. Also, if the product type of IC3 is 74 LVC which allows high-speed driving, but whose withstand voltage is approximately intermediate, VccH is set at 5.5 V or lower.

In FIG. 1, at the turn-off time, the gate G of Q1 and the gate G of Q2 are also driven with the charge carriers Qg from IC3 2/6~6/6 by the SBDs D11 and D12 via the capacitors C1 and C2. As a result, the turn-off delay almost disappears. At the turn-on time, the driving for the high-frequency component is limited by the SBDs D11 and D12 and the ferrite beads L5 and L6, and thus the turn-on is delayed. As a result, the conduction time-period and the non-conduct ion time-period become mutually substantially equal to each other between Q1 and Q2, and thus the simultaneous ON time-period disappears between Q1 and Q2. Accordingly, if the compatibility of characteristics of the ferrite beads L5 and L6 is preferable, Q1 and Q2 are not brought into the simultaneous conduction, and thus the feedthrough current ceases to flow.

In FIG. 2, at the turn-off time, the gate G of Q1 and the gate G of Q2 are also driven with the charge carriers Qg from IC3 by the SBDs D11 and D12 via the capacitors C1 and C2. As a result, the turn-off delay almost disappears. At the turn-on time, the driving for the high-frequency component is limited by the SBDs D10 and D13 and the ferrite beads L5 and L6, and thus the turn-on is delayed. As a result, even in the case where the compatibility of characteristics of the ferrite beads L5 and L6 is not necessarily optimum (which means that, at a switching fundamental-wave frequency, the impedance of each ferrite bead does not drop enough, i.e., higher than about ½nd as compared with the impedance of the gate-electrode capacitor or the impedance of the CMG capacitor, and that, at a frequency whose corresponding period is equal to the turn-off time of the switching, the impedance of each ferrite bead does not rise enough, i.e., lower than about 2 times as compared therewith), the conduction time-period and the non-conduction time-period become mutually substantially equal to each other between Q1 and Q2, and thus the simultaneous ON time-period decreases between Q1 and Q2. Moreover, the feedthrough current is decreased by the ferrite beads L1 and L2, and thus the feedthrough current becomes exceedingly small in amount.

As a consequence, even if the CMG voltage amplitude is made larger thereby to increase the drain currents of the MOSFETs, and to increase the charge carriers Qg even further, the feedthrough current during the simultaneous ON time-period of Q1 and Q2 becomes exceedingly small down to a negligible extent. This feature makes it possible to ensure the CMG voltage amplitude and the rectangular waveform, to prevent the sensitivity lowering, and to improve the effective sensitivity. Also, the power loss is reduced by the amount equivalent to the smallness of the feedthrough current, which reduces the heat liberation and temperature rise, and enhances the sensitivity even further.

Making the comparison between FIG. 1, FIG. 2, FIG. 4, and FIG. 5 for illustrating the embodiments of the present invention, and FIG. 7 and FIG. 8 for illustrating the embodiment of the conventional technologies results in the following comparison consequences: The in-series resistors R6 and R7 of the conventional technologies for turning-off the gates of the MOSFETs Q1 and Q2 are short-circuited (i.e., eliminated). This feature allows implementation of the higher-speed turn-off of Q1 and Q2 (i.e., the turn-off time-period becomes shorter).

Also, the in-series resistors R5 and R8 for turning-on the gates of Q1 and Q2 are replaced by the ferrite beads L5 and L6. This feature makes it possible to limit the driving for the high-frequency component, and thus to delay the turn-on even further. Moreover, in the present embodiment, the diodes D6~D9 of the conventional technologies are replaced by the SBDs D10~D13. This feature allows ⅓rd-implementation, i.e., from 0.6 V to 0.2 V, of the forward-direction drop voltage in a small-current area. Accordingly, the CMOS logic integrated circuit becomes available whose power-supply voltage is lower and which allows higher-speed driving by the amount equivalent to the condition of being able to make the logic power-supply voltage smaller.

Concretely, in FIG. 1, FIG. 2, FIG. 4, and FIG. 5, the gate voltage at which the ON resistance of the Pch-MOSFET Q1 drops is equal to, e.g., 4.5 V, which is significantly high. Consequently, the direct-current reproduction diode D3 is replaced by the 0.3-V forward-direction drop voltage SBD, thereby ensuring the gate voltage Vgs=−5.4 V~−4.7 V of the Pch-MOSFET Q1 at the ON time. Also, although the gate voltage is ensured, the difference is simultaneously reduced between the power-supply voltage of the CMOS logic integrated circuit and the output voltage of the CMOS logic integrated circuit when the carrier extraction is driven by a threshold voltage of the gates of the MOSFETs. If, however, a plurality of, e.g., 3 pieces, high-speed CMOS logic integrated circuits IC3, such as the LVC series which guarantee 24-mA driving current, are connected in parallel to each other, VccH may be set at 5 V. If IC1 is replaced by an even-higher-driving-capability product type, or if the number of parallelism is increased, the direct-current reproduction diode D3 may be replaced by the 0.2-V forward-direction drop voltage SBD.

Figure 4:
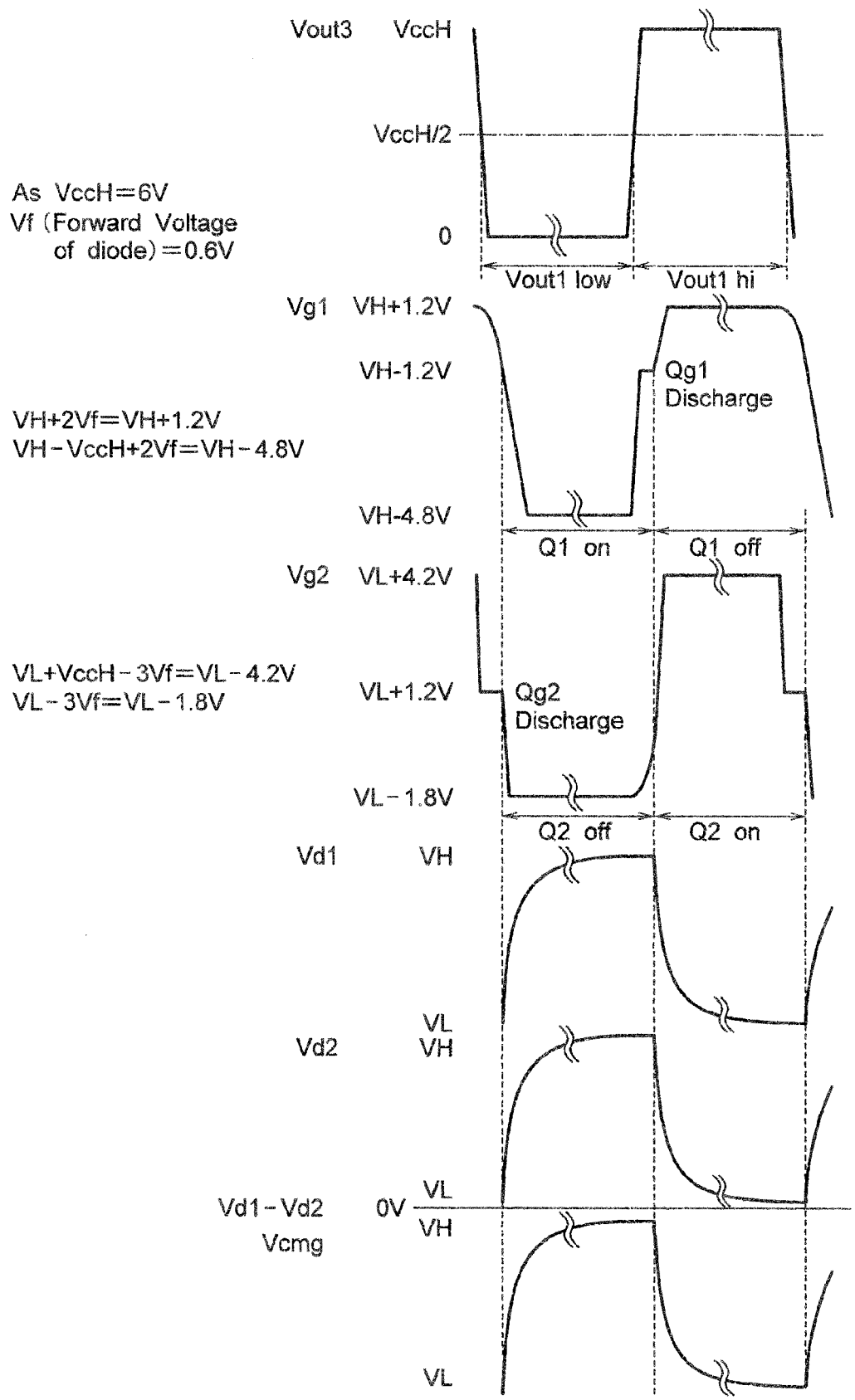
FIG. 4 is a schematic diagram for illustrating the output waveform operation of the complementary-MOSFET driving circuit in the embodiment of the present invention (ferrite bead is inserted in series with the gate)
Figure 5:
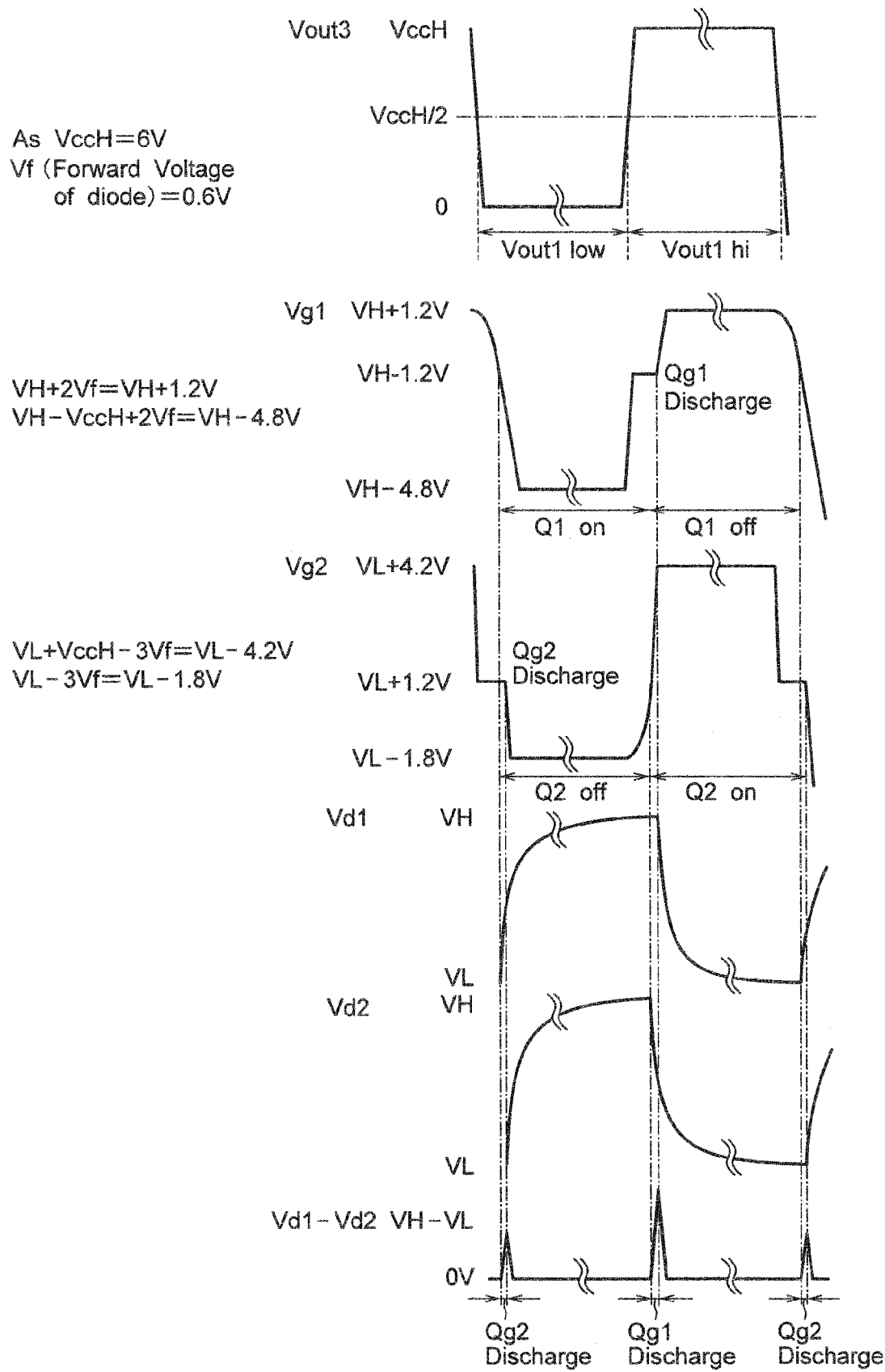
FIG. 5 is a schematic diagram for illustrating the output waveform operation of the complementary-MOSFET driving circuit in another embodiment of the present invention (ferrite bead is inserted in series with the gate and in series with the drain)

As a consequence, the operations of the switching circuits illustrated in FIG. 1 and FIG. 2 for illustrating the embodiments of the present invention become the operations (Vg1 waveform) illustrated in the schematic diagrams FIG. 4 and FIG. 5 for illustrating the input/output voltages of the operations of the embodiments of the present invention, where the MOSFET driving circuits drive the gates comparatively late at the turn-on time, and drive the gates comparatively early at the turn-off time. As a result, the time-period during which the Nch-MOSFET Q2 and the Pch-MOSFET Q1 are brought into the simultaneous conduction becomes exceedingly small down to a negligible extent. Accordingly, the attenuation of the load CMG voltage amplitude is decreased down to about 0.2 V to decrease the sensitivity lowering down to about ½nd. This is because, since the sensitivity varies by the amount of 1.4 times as a result of a 0.1-V voltage amplitude variation, the sensitivity varies by the amount of 2 times as a result of the 0.2-V voltage amplitude variation. This decrease in the sensitivity lowering results in the implementation of the sensitivity enhancement which is about 80 times higher as compared with the approximately ¹⁄₁₆₀th sensitivity lowering in the conventional embodiment. Also, the power loss is reduced by the amount equivalent to the smallness of the feedthrough current, which reduces the heat liberation and temperature rise, and enhances the sensitivity even further.

Furthermore, in FIG. 1, the ferrite beads L5 and L6 maintain the impedance of the high-frequency component in the conduction-start (i.e., turn-on) direction at a high value, thereby maintaining the delay in the turn-on of the Pch-MOSFET Q1 and the Nch-MOSFET Q2. In addition, the ferrite beads eliminate the forward-direction drop voltages for the diodes D10 and D13 in the conduction-start (i.e., turn-on) direction in FIG. 5, sufficiently ensure the MOSFET gate-source voltages at the time of the conduction, lower the ON resistances of the MOSFETs Q1 and Q2 at the time of the conduction, and improve the rectangular-wave characteristics of the CMG voltage, thereby enhancing the sensitivity of the EM-CCD even further. The improvement of the rectangular-wave characteristics of the CMG voltage makes it highly unlikely that there will occur the lowering in the horizontal resolving power at the high electron-multiplying time when the CMG voltage amplitude is large, and that there will occur the blooming. Here, the blooming is the phenomenon that the charge carriers, which leak out to the vertical transfer path due to an excessive light amount, overflow one after another from the accumulation-unit transfer path to the horizontal transfer path.

Also, an embodiment of the present invention is also applicable to the driving for the read-out charge multiplication gate of the EM-CCD whose capacitive load is equal no about 85 pF and about 55 pF and whose CMG voltage amplitude is equal to 8 Vp-p. Namely, the embodiment is applied not only to the charge-multiplication-gate driving unit 10 in FIG. 9, i.e., the block diagram for illustrating the configuration of the imaging apparatus using the EM-CCD imaging device, but also to the horizontal-transfer driving unit 9 therein. Concretely, it is preferable to form the switching circuit in FIG. 1 or FIG. 2 in two sets, to set the input Vi into the normal phase and reverse phase, and to connect the output Vo to the horizontal transfer paths SRG1 and SRG2.

Although, in FIG. 8, the inclination of the rising-edge waveform of Vcmg is steep, but the inclination of the falling-edge waveform of Vcmg is gentle, in FIG. 4, the inclination of the rising-edge waveform of Vcmg as well as the inclination of the falling-edge waveform of Vcmg become steep. This feature improves the rectangular characteristics and symmetrical property of the CMG voltage amplitude of the charge multiplication gate to increase the maximum carrier amount which is transferable, thereby making it highly unlikely that there will occur the blooming, i.e., the phenomenon that charge carriers, which leak out to the vertical transfer path due to an excessive light amount, overflow one after another from the accumulation-unit transfer path to the horizontal transfer path.

Hereinafter, referring to FIG. 3 and FIG. 6, the explanation will be given below regarding another embodiment of the present invention.

Figure 6:
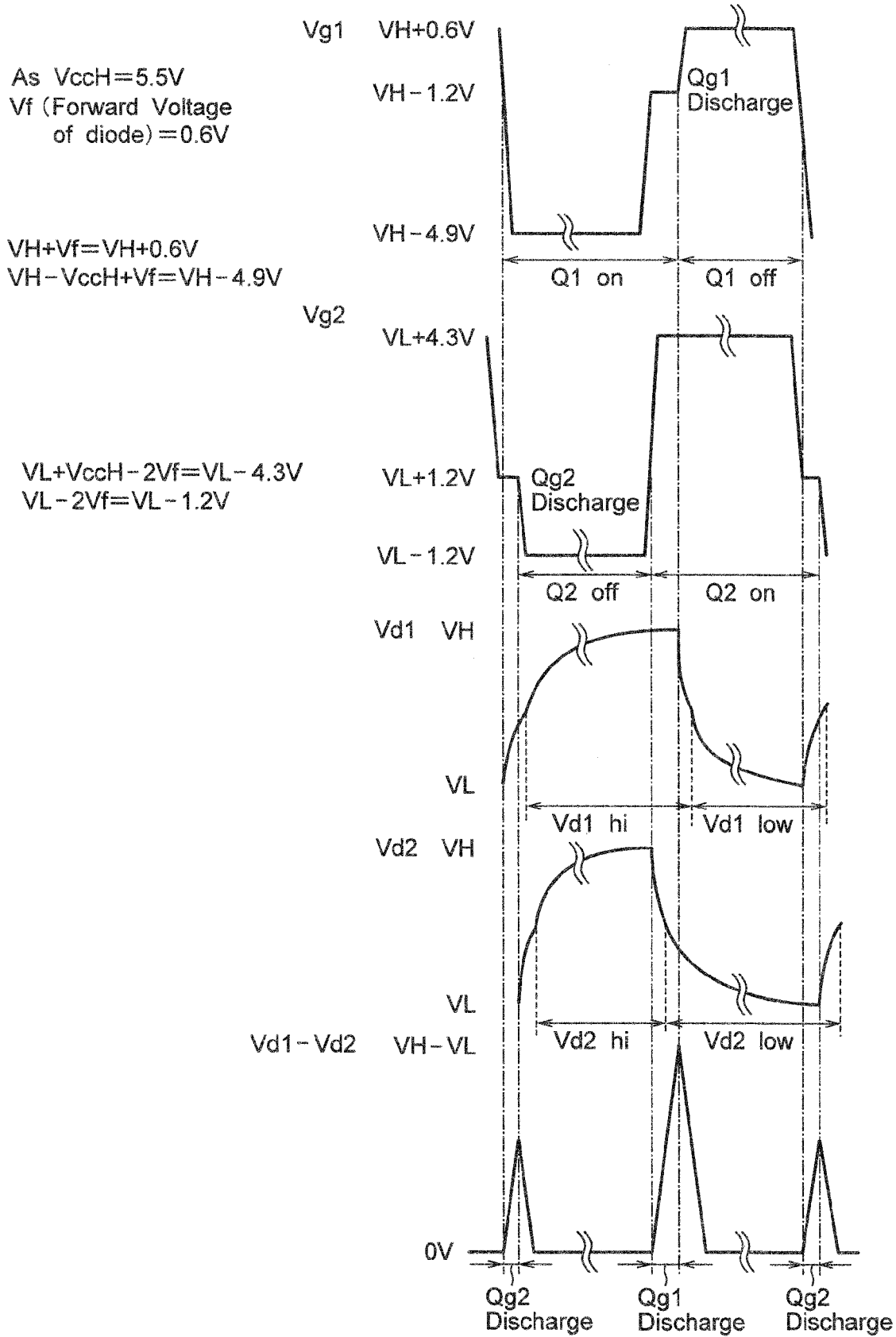
FIG. 6 is a schematic diagram for illustrating the output waveform operation of the complementary-MOSFET driving circuit in still another embodiment of the present invention (ferrite bead is inserted in series with the drain)

In FIG. 3 and FIG. 6, the gate voltage at which the ON resistance of the Pch-MOSFET Q1 drops is equal to, e.g., 4.5 V, which is significantly high. Accordingly, VccH is set at a value which is lower than the recommendable maximum voltage of IC1. Namely, if the product type of IC1 is 74 AC which allows high-speed driving, whose driving current is large, and whose withstand voltage is comparatively high, VccH is set at 6 V or lower. Also, if the product type of IC1 is 74 LVC which allows high-speed driving, but whose withstand voltage is approximately intermediate, VccH is made variable in a range lower than 5.5 V.

The charge carriers Qg and the turn-off delay of the Nch-MOSFET Q2 are smaller than those of the Pch-MOSFET Q1. At the same time, the gate voltage at which the ON resistance of Q2 drops is equal to, e.g., 2.5 V, which is significantly low. Consequently, if the product type of IC2 is 74 LVC, which allows high-speed driving, whose driving capability is large, and which tolerates an input voltage higher than the power-supply voltage, VccL is set at 4.5 V.

Even if, like Vd1-Vd2 indicated at the bottom in FIG. 6, there occurs a potential difference in the high-frequency component between the drain of the Pch-MOSFET Q1 and the drain of the Nch-MOSFET Q2, the high-frequency current, i.e., the main component of the feedthrough current, is limited by using the ferrite beads. Here, the impedance of each ferrite bead at 12. MHz or 37.5 MHz is lower than the impedance of the capacitive load, and the impedance amount of each ferrite bead is high at 100 MHz or 300 MHz, i.e., the frequency whose corresponding half-period is equal to the simultaneous conduction time of the switching circuits.

As a consequence, even if the CMG voltage amplitude becomes larger thereby to increase the drain currents of the MOSFETs, and to increase the charge carriers Qg even further, the feedthrough current is exceedingly small. This feature makes it possible to ensure the CMG voltage amplitude and the rectangular waveform. Accordingly, the attenuation of the load CMG voltage amplitude is decreased down to about 0.8 V to decrease the sensitivity lowering down to about $\frac{1}{15}$th. This decrease in the sensitivity lowering results in the implementation of the sensitivity enhancement which is about 10 times higher as compared with the approximately $\frac{1}{160}$th sensitivity lowering in the conventional embodiment. Also, the power loss is reduced by the amount equivalent to the smallness of the feedthrough current, which reduces the heat liberation and temperature rise, and enhances the sensitivity even further.

Also, making the comparison between FIG. 3 and FIG. 6 for illustrating the embodiments of the present invention, and FIG. 7 and FIG. 8 for illustrating the embodiment of the conventional technologies results in the following comparison consequences: The logic IC power-supply voltage VccH is lowered by the amount equivalent to the highness of the gate voltage Vg1 at which the ON resistance of the Pch-MOSFET Q1 drops, and the logic IC power-supply voltage VccL is lowered by the amount equivalent to the lowness of the gate voltage Vg2 at which the ON resistance of the Nch-MOSFET Q2 drops. This processing uniformalizes the ON resistance of the Pch-MOSFET Q1 and the ON resistance of the Nch-MOSFET Q2. As a result, although, in FIG. 8, the inclination of the rising-edge waveform of Vcmg is steep, but the inclination of the falling-edge waveform of Vcmg is gentle, in FIG. 4, the inclination of the rising-edge waveform of Vcmg as well as the inclination of the falling-edge waveform of Vcmg become steep. This feature allows the improvement in the symmetrical property of the CMG voltage amplitude.

Moreover, the high-frequency current, i.e., the main component of the feedthrough current, is limited by using the ferrite beads L1 and L2. This feature allows the simplification in the number of the configuration components of the date driving circuit. In the present embodiment, the large-permissible-loss resistors R3 and R4 for limiting the feedthrough current are replaced by the ferrite beads L1 and L2 in chip size. This feature allows the small-sized implementation of the circuit. Furthermore, the ferrite beads eliminate the forward-direction drop voltages for the diodes D6 and D8 in the conduction-start (i.e., turn-on) direction in FIG. 7, sufficiently ensure the MOSFET gate-source voltages at the time of the conduction, lower the ON resistances of the MOSFETs Q1 and Q2 at the time of the conduction, and improve the rectangular-wave characteristics of the CMG voltage, thereby enhancing the sensitivity of the EM-CCD even further. The improvement of the rectangular-wave characteristics of the CMG voltage makes it highly unlikely that there will occur the lowering in the horizontal resolving power at the high electron-multiplying time when the CMG voltage amplitude is large, and that there will occur the blooming. Here, the blooming is the phenomenon that the charge carriers, which leak out to the vertical transfer path due to an excessive light amount, overflow one after another from the accumulation-unit transfer path to the horizontal transfer path.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A switching circuit whose power-supply voltage exceeds 6 Volts (V), and which drives a load,
said switching circuit, comprising:
a P channel (Pch) metal-oxide-semiconductor field-effect transistor (MOSFET);
a N channel (Nch) MOSFET; and
a logic buffer,
wherein a ferrite bead, which delays the turn-on of said Pch MOSFET and said Nch MOSFET, is connected to a conduction-termination direction diode in parallel thereto,
wherein impedance of said ferrite bead being lower than one-half of gate-electrode impedance of one of said Pch MOSFET and said Nch MOSFET and said impedance of said ferrite bead is high at a frequency whose corresponding half-period is equal to a simultaneous conduction time of said switching circuit, and
wherein conduction-termination direction diode being inserted in series into between output of said logic buffer and gate electrodes of said Pch MOSFET and said Nch MOSFET.

2. The switching circuit according to claim 1, wherein said load being a capacitive load.

3. The switching circuit according to claim 2, wherein a ferrite bead is inserted into at least one drain electrode of said Pch MOSFET and said Nch MOSFET, and impedance of said ferrite bead at a switching fundamental-wave frequency being lower than one-half of impedance of said capacitive load at said switching fundamental-wave frequency.

4. A switching circuit whose power-supply voltage exceeds 6 Volts (V), and which drives a capacitive load,
said switching circuit, comprising:
a P channel (Pch) metal-oxide-semiconductor field-effect transistor (MOSFET);
a N channel (Nch) MOSFET; and
a logic buffer,
wherein a ferrite bead, which reduces feedthrough current in said Pch MOSFET and said Nch MOSFET, is inserted into at least one drain electrode of said Pch MOSFET and said Nch MOSFET, and
wherein impedance of said ferrite bead being lower than one-half of impedance of said capacitive load at a switching fundamental-wave frequency and said impedance of said ferrite bead is high at a frequency whose corresponding half-period is equal to a simultaneous conduction time of said switching circuit.

5. The switching circuit according to claim 4, wherein ferrite beads are inserted in series between output of said logic buffer and gate electrodes of said Pch MOSFET and said Nch MOSFET, and impedance of said ferrite beads at said switching fundamental-wave frequency being lower than one-half of impedance of said capacitive load at said switching fundamental-wave frequency.

* * * * *